United States Patent [19]

de Masi

[11] Patent Number: 4,820,396
[45] Date of Patent: Apr. 11, 1989

[54] RACK OR TRANSPORT TOOL FOR THE MANUFACTURING OF PRINTED WIRED BOARDS

[76] Inventor: Amerigo de Masi, Brandenburgerstr., 62-6073 Egelsbach, Fed. Rep. of Germany

[21] Appl. No.: 686,471

[22] Filed: Mar. 18, 1985

[51] Int. Cl.$^4$ .................... C25D 17/04; B05C 11/14
[52] U.S. Cl. ................... 204/297 W; 118/500; 118/503
[58] Field of Search ............... 204/297 W; 118/500, 118/503

[56] References Cited

U.S. PATENT DOCUMENTS

| | | | |
|---|---|---|---|
| 2,699,144 | 1/1955 | Peterson | 118/500 |
| 2,847,378 | 8/1958 | Mundell | 204/297 W |
| 3,290,238 | 12/1966 | Wierwille | 204/297 W |
| 3,314,877 | 4/1967 | Novitsky | 204/297 W |
| 3,429,786 | 2/1969 | Kubik | 204/297 W |
| 3,677,929 | 7/1972 | Young | 204/297 W |
| 4,014,778 | 3/1977 | Harrison | 204/297 W |
| 4,129,093 | 12/1978 | Johnson | 118/401 |
| 4,148,707 | 4/1979 | Mayer | 204/297 W |
| 4,199,613 | 4/1980 | Johnson | 427/2 |
| 4,351,266 | 9/1982 | Ando | 204/297 W |
| 4,610,773 | 9/1986 | Takayasu | 204/285 |

*Primary Examiner*—John F. Niebling
*Attorney, Agent, or Firm*—Robert J. Koch

[57] ABSTRACT

A rack or transport tool for the printed wire industry which rationalizes its many operations by unifying them through the use of new process tanks all accepting the above same tool. This rack mechanically secures and processes panels, vertically, most already drilled or punched with holes, so that any chemicals, or spray water or pressurized air will have free access to clean or dry or chemically treat these holes and adjacent surfaces which are previously through plated with copper or any wished metal. To accomplish so many diversifyed operations, a change in the work method is necessary. Each panel must be provided with two or more notches on its edges so that the tool will not rely on an apparent clamping force to hole the panels but on the captive ability of these various notches, transversally mating each other to prevent the panels to fall off under the action of pressurized water, air, hydrostatic force, solutions and cathode agitation. The tool is so designed to fit tanks also built with special features; the anodes are connected together from the bottom to form together a magazine extending sideways in relation to the tank and mating with the panels/rack magazine, so that the interspaces are respectively filled by the anodes and by the panels. The use of such a multiple carrying tool permit an extreme high production with an increased degree of quality.

16 Claims, 7 Drawing Sheets

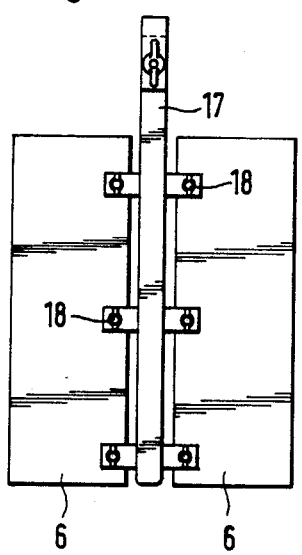
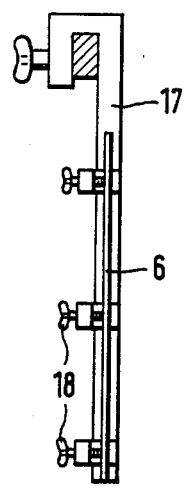
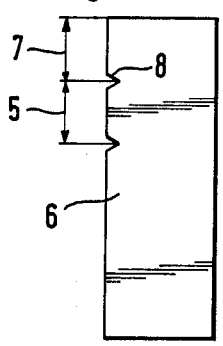
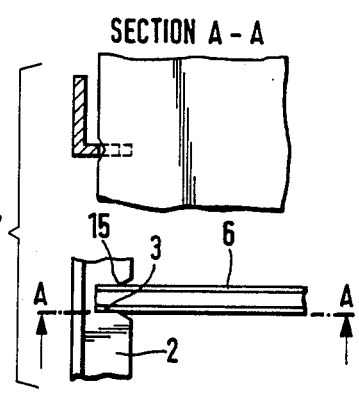

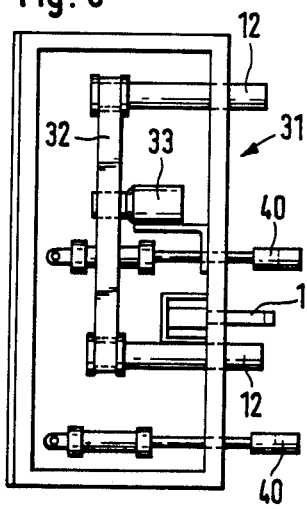
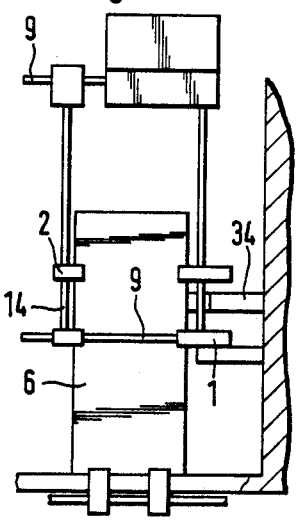
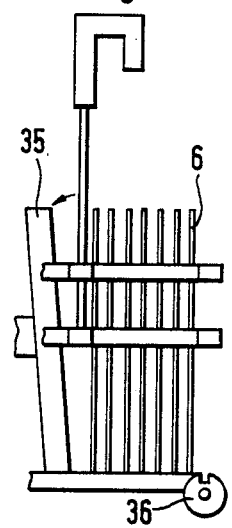
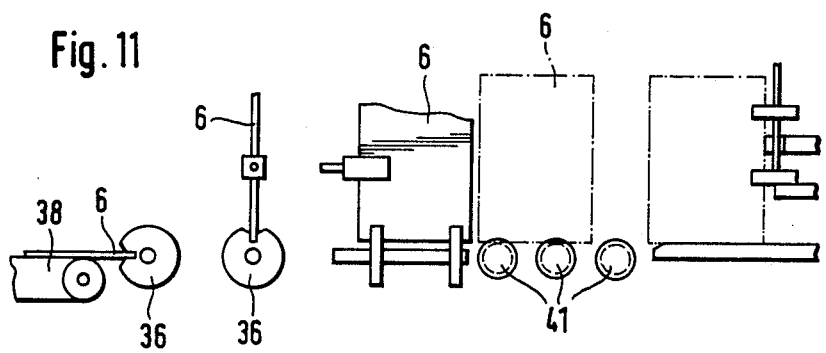
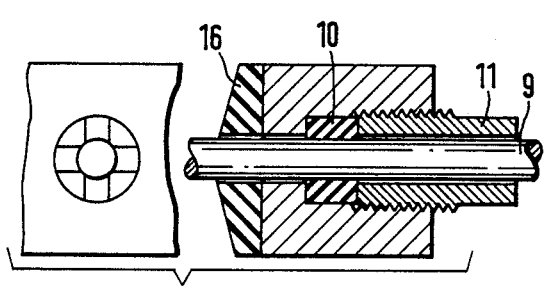
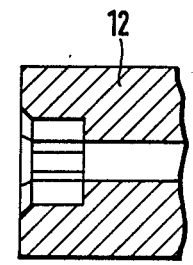

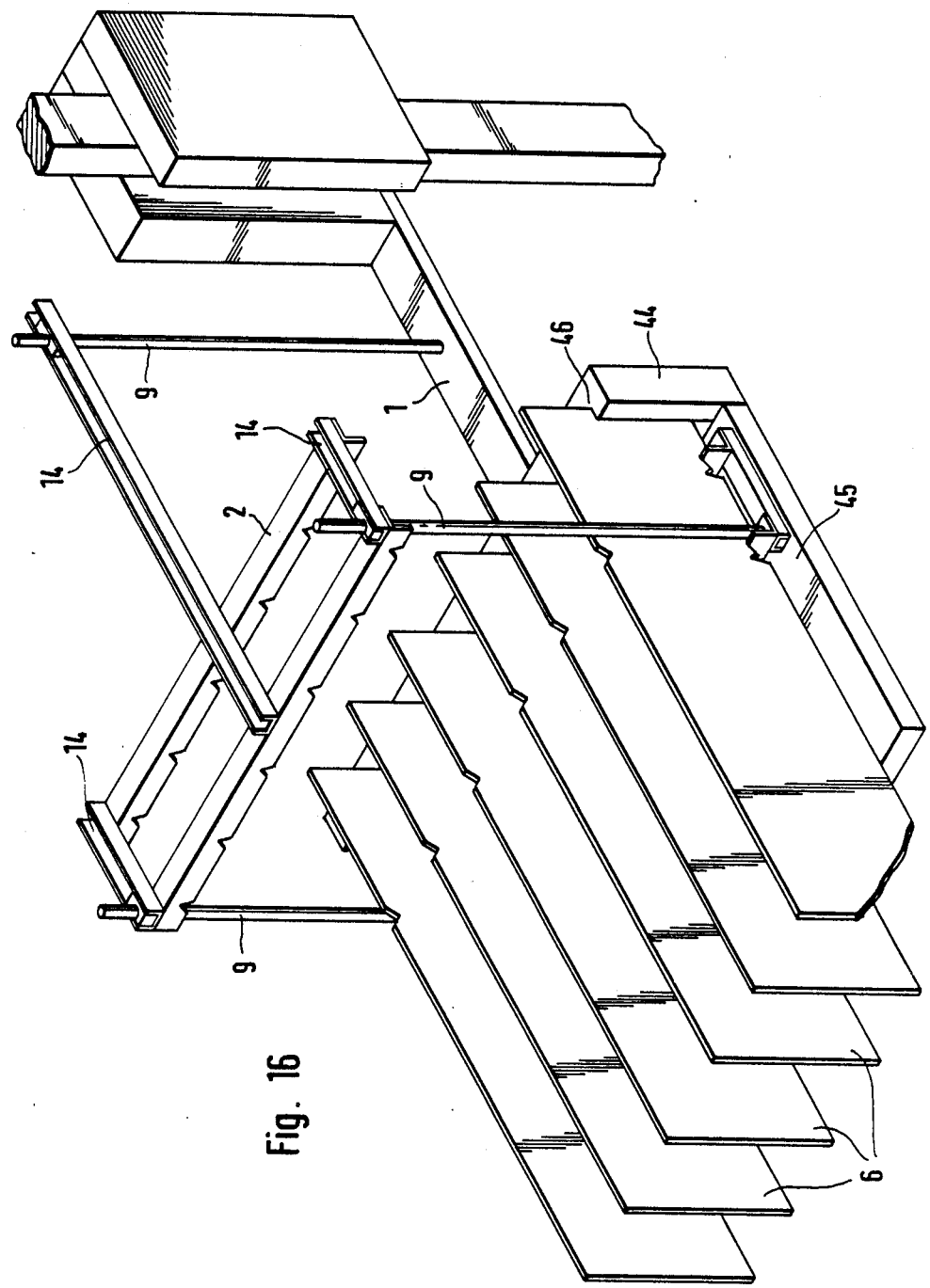

RACK OR TRANSPORT TOOL FOR THE MANUFACTURING OF PRINTED WIRED BOARDS

FIELD OF INVENTION

This invention relates to the manufacturing of a printed wired board and its technology.

BACKGROUND OF THE INVENTION

A printed wired board or printed circuit board like some call it, prior to assume the appearances commonly known by the public, starts his production process as a panel, copper cladded on one or two sides, of dielectric material. The copper thickness can range from 15 um up to 35 um, and the dielectric thickness from 25 um up to 5 mm. This panel must go through many operations or technologies which determine the kind of printed wired board.

To mention the most important they are: Drilling of the holes which at a finished product will be used to insert electronic components, electroless and electrolitic plating, photographic development, chemical milling, photo resist exposure, silkscreen printing, lacquer stripping, tin lead, gold, silver, rodhium, nikel, copper plating, hot air drying, and water rinse after each station, usually done by dipping or spraying. Contrary to this repeated rinsing stations, the new rack permits the construction of one movable water rinse station, which travels alongside the fixed process tanks, and through the spray nozzle pipes later in the description shown, likewise for the anodes, it inserts a magazine, or more, of panels between the spaces of the said anodes or said nozzles, rinsing them or whatever other operation is required.

The quality of the printed wired board is greatly increased considering that the panels are not handled between each operation and no sticky residues coming from contaminated developing, etching, stripping machines can damage the surface of the panels and their holes.

These operations are performed while the panels are suspended in the air, facing anodes or spray nozzles, vertically, through the whole process, except the lamination which is not a part of the invention.

It must be acknowledged that each panel contains one or more image, stepped up, of the printed circuit board, by which the total size and weigth of the panels increases considerably.

In the figures that follow this description, it has been shown also a version of the tool used in a full automated production line, together with a loading device used at beginning of each cycle.

As in the past, today the most popular rack used for the fabrication of printed wired board is the spine rack type shown in FIG. 5. On this rack a thumb screw provides both, electrical contact and mechanical support. This spine rack is included in the application to show the importance of having a secure tool of production. The certainty of having good mechanical hold and good electrical contact, is believed in the industry to lay with the positive pressure of a screw.

SUMMARY OF THE INVENTION

The present invention is intended to process printed wired boards vertically, in big lots, and through their entire chemical processing cycle by using a transport rack unified to each operation. The tool submitted not only allows the production's advantages above mentioned, but also the construction of a new and economical type of equipment for the printed circuit industry, since the disposition of the panels is sideways instead of longways in relationship to the tank, and in any operation, assumes the form of a magazine, saving space and the construction of expensive conveyorized machines already in use today. In this invention a change in the methode of preparing the panels for the production is also claimed; two or more notches, set at a distance between one from the other, corresponding to the distance on part (1) and (2). Furthermore, said invention is expanded by the addition of a loading tool in FIG. 16 which allows not only a speedy loading operation but also keeps the considerably heavy panels to stand vertically while the second half (2) of the rack is set in place to secure them. As it is seen throughout the figures, the part (1) has an L-shaped metallic member with a bore in it to allow a straight insertion of the panels through the anodes or spray nozzles, only for manual application, whereas in FIG. 16, part (1) and (2) are identical since the positioning or insertion of the panels between the above anodes or nozzles is accomplished with photocells or other electrical devices available on the market.

GENERAL DESCRIPTION OF THE INVENTION

The invention relates to a fixture to hold, support and transport panels for the manufacturing of printed wired boards in combination with process tanks to perform different process steps in big quantity, at the same time, uninterrupted, in a production line.

A high number of process steps is involved in the manufacturing of printed wired boards, particularly for boards which require their holes to be through plated. Presently these steps are performed with spine racks as far as the plating is concerned, and with conveyorized machines in the rest of the process's cycle. But this state of the art produces many quality problems by the handling of the panels from step to step and is limited in panels productivity.

Key element in such a production line is a fixture to transport the panels and the different process tanks required for different processes. The most popular fixture, today, to transport panels, consist of a bar, like in FIGS. (4) and (5), to which severals metallic forks are attached through which a thumb screw is provided. The panels are inserted in these forks and secured by the screws. Such a rack cannot only fit through conveyorized machines to continuously complete the process cycle, but cannot be used in a magazine type of operation for lack of space in the plating tanks and limitation of productivity. In order to produce more, it is well known in the art, the use of pan or basket racks. A very important disadvantage of this rack is, that although it can carry big panels load through the electroless plating operation, it cannot be used through the subsequent electrolytic plating without dismounting the panels, because of its design not being abel to accomodate the anodes or the spray nozzles; during the vertical panels' descent, members of the rack would encounter anode bars laying across the existing tanks. Only the submitted rack, which is the main embodiment of the invention, can perform both operations carrying big loads and extending its usefullness to the subsequent steps in the FIG. 15. Furthermore it can combine the advantages of both type of racks; fast copper or other metall depositions of the spine rack and production of big loads of the basket rack.

It is part of the present invention to define a rack for the transport of panels combined with suitable process tanks which allow the construction of a production line with continuous flow of material to perform electroless and electrolytic processes without reloading the panels to be processed, on a different transport tool or conveyor.

According to the invention this is accomplished by providing a frame supporting the panels with two parts mating one with the other, parallel, between which panel are firmly held, evenly spaced; the first part consisting of at least two superpositioned and connected L-shaped members, each having equidistant notches on the inner side, whose opening large enough to accomodate the panels' thickness; each member having through the end of the L-shaped member a bore to accept a rod (1A), in FIGS. 1, 2, 3 of the process tanks (19) (20) (24), by which, in a manual version, the panels are positioned in between the anodes and the spray nozzles (23) (26). The second part of the frame consists of at least two parallel connected members, each bearing equidistant notches facing the notches of the first member and being rigidely connected to at least two members, parallel to each other. The two parts are mated to each other by at least two members which can be chosen having different lengths to suit the panels' breadth and to secure the panels with a tightening device applyed at one end. Their opposite ends are screwed in part (1) in a manner to form an homogeneous unit. The notches of both parts of the rack are so designed that they can provide a natural electrical contact with the ones provided on the panels, which, by their vertical position mate the opposite notches rotated by 90°. The connecting members which mate the two parts of the rack are inserted, by one end through holes on part (2) of the rack where, instead of a tightening device, as shown in FIG. 12, a normal screw can also be used to hold such a member by axial movements.

The process tanks are provided with tubes attached to one side of the tank which slide through the bores of the L-shaped member of the part (1).

At least one of the process tank contains a system of pipes departing from the bottom of the tank, from which single pipes, built vertically, extending toward the top of the tank, and spaced like the panels, are provided with nozzels to evenly distribute liquids. The bottom of the process tank containing the tube system, has several openings equipped with drain valves and connected with a separated drainage system. Drain valves are here also intended as covers which can be automatically closed or opened, acting in this manner as a valve.

At least one second tank is provided with an electrical conductor, placed on the bottom, having fork shaped prongs to hold and electrically connect solid anodes or titanium basket anodes for the metal to be plated.

These anodes are placed and tightened parallel to the panels.

The invention is illustrated in the drawing representing one assembly, however, a long tank can be used giving the possibility to process several rack loads or magazines with their own respective anodes or spray nozzel system.

BRIEF DESCRIPTION OF THE DRAWINGS

FIG. 4 is a spine rack mostly used today by the industry, with two panels mounted on it.

FIG. 5 is a side view of FIG. 4.

FIG. 6 is an elevated view of a panel prepared for the production with two notches to fit transversally the ones on the part (1) and (2) of the rack.

FIG. 7 is a plan view of panel and part (1) of the rack where the notches mate and a section of member on part (1) where the supporting of the panels and the electrical contact takes place.

FIG. 8 is an auxiliary tool to automatically tighten and untighten the part (2) from part (1).

FIG. 9 is an auxiliary tool to load and unload the panels and set them in rotating slots.

FIG. 10 is a section of the auxiliary tool shown in FIG. 9.

FIG. 11 is a device to turn the panels by 90° to continue their travel in horizontal.

FIG. 12 is a tightning device to fasten the second half of the rack to the first.

FIG. 13 is a turning socket head tool being used with the device of FIG. 8.

FIG. 16 is a loading fixture to assemble the panels in a magazine form at the very beginning of the cycle. Also shown is a version of the part (1) of the rack for automatic positioning of the panels in the process tanks.

DETAILED DESCRIPTION OF THE PREFERRED EMBODIMENTS

Figure 1:
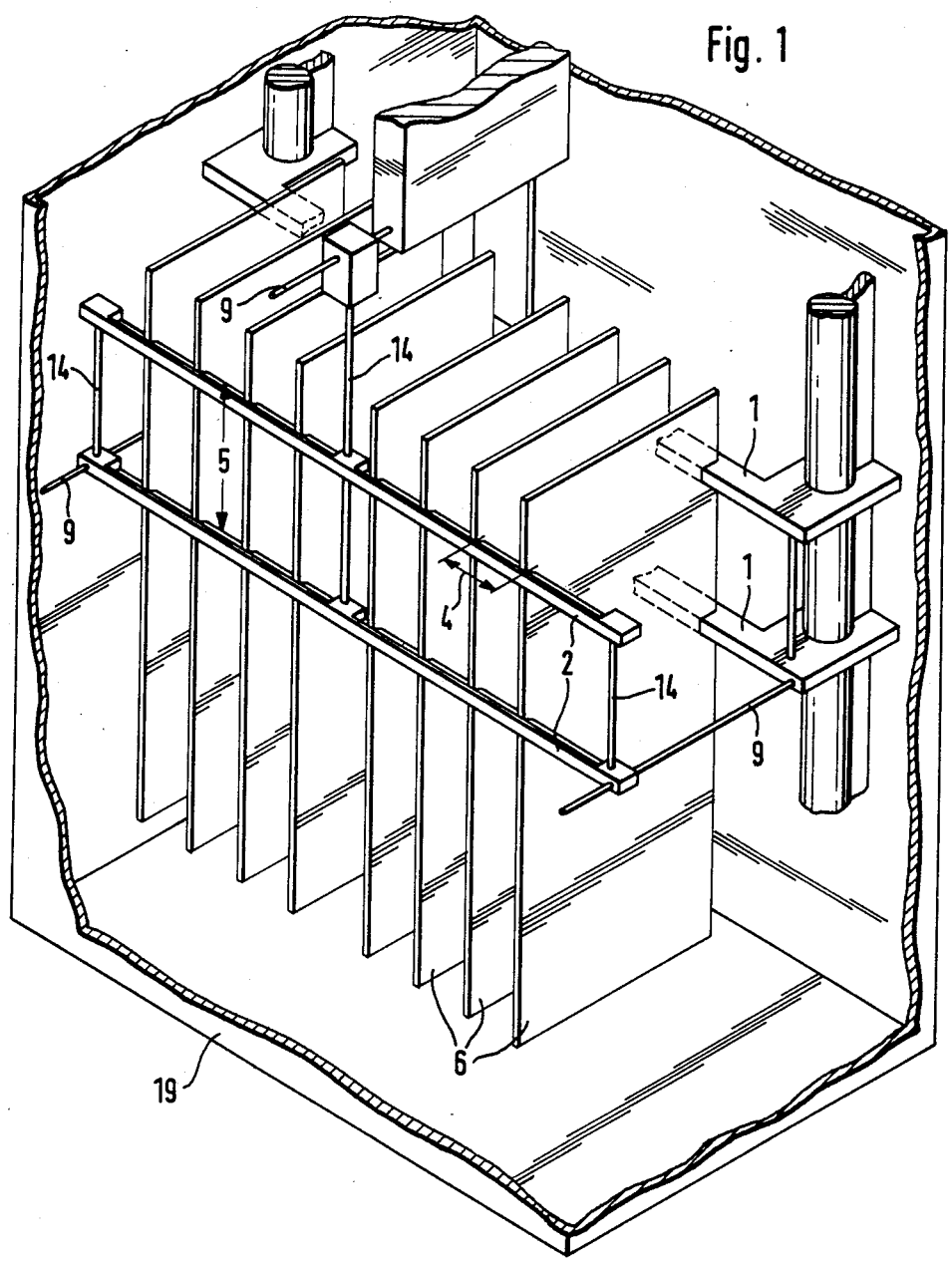
FIG. 1 is an isometric view of a processing tank, with the front and side ends sectioned, to show a rack loaded with panels in a processing position.

The FIG. 1 consists of a rack or transport tool formned by two parts (1,2) between which the panels (6) are held secured throughout the chemical process that follows. The first part (1) of the rack consists of two parallel L-shaped members, at a distance one over the other and fastened together through rods. On each L-shaped member, facing the edges of the panels (6), a row of notches is provided, to accomodate the panels' thickness.

Figure 2:
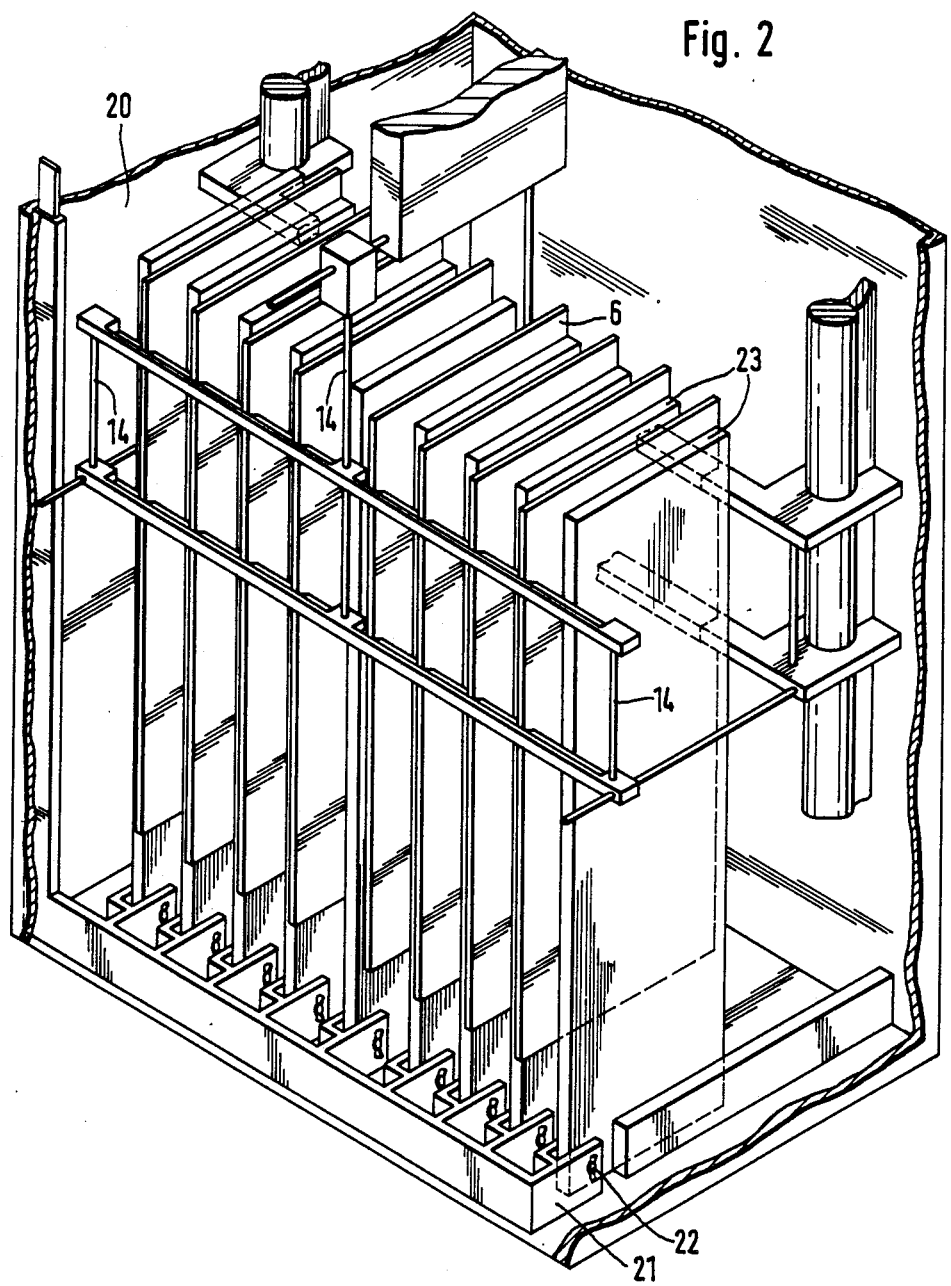
FIG. 2 is an isometric view of a processing tank, with the front and side ends sectioned, to show a rack loaded with panels facing anodes in a processing position.
Figure 3:
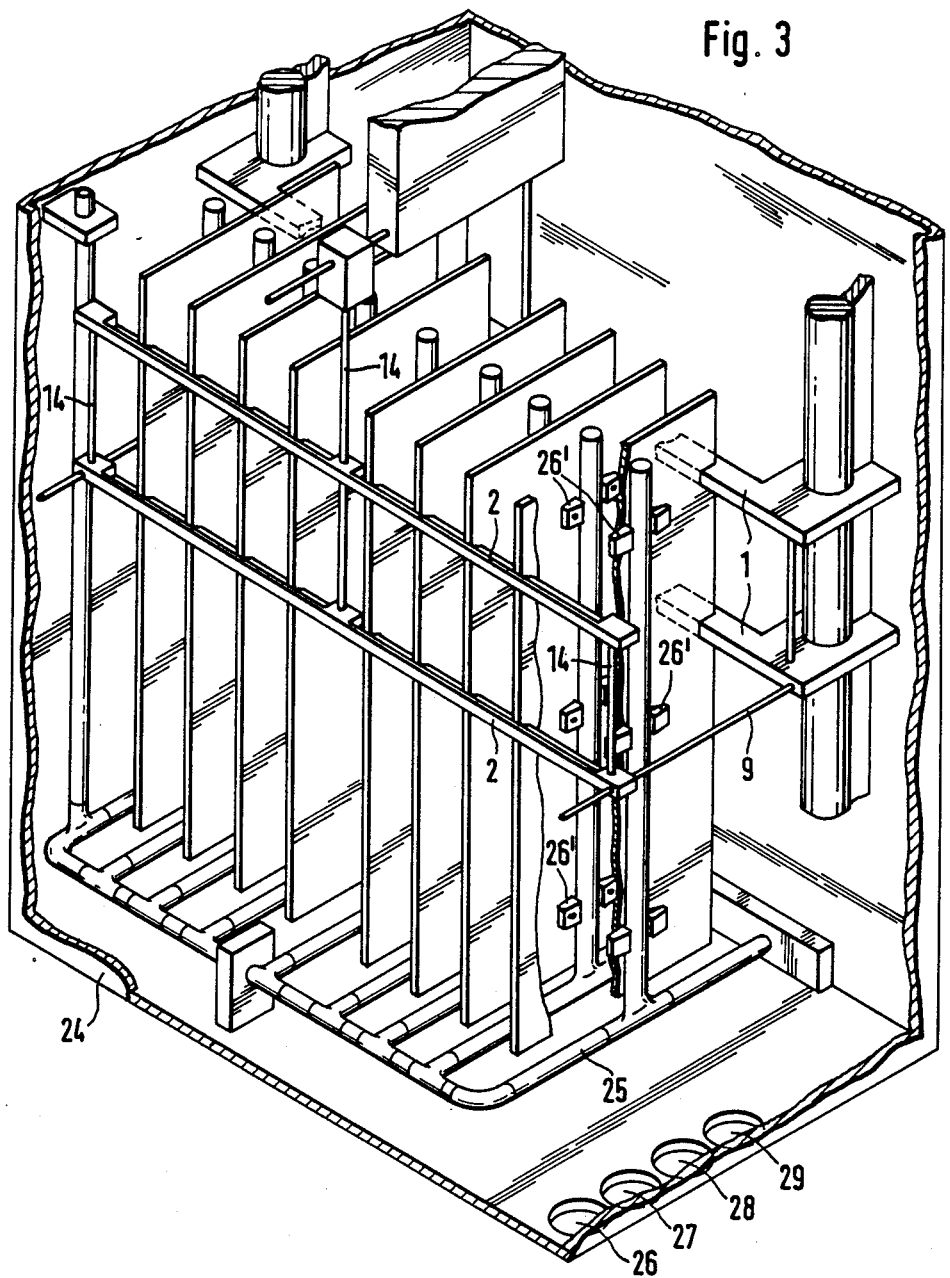
FIG. 3 is an isometric view of a processing tank, with the front and side ends sectioned, to show a rack loaded with panels facing rows of nozzels and the pipe network.

The extremities of the above mentioned members are provided with bores which in combination with the tube (1A), fastened on each tank (19) (20) (24), allow the positioning of the panels (6) exactly in between the anodes (23) of FIG. 2 and the nozzels of FIG. 3, by sliding over it. It must be noticed however, that the L-shaped members are used only on the manual version of the rack, whereas in FIG. 16, the version of the rack for automatic transport and lowering applications has no such L-shaped member with bores in it. This first part of the rack, as seen later in the figures, is built exactly the same as part (2).

Also on part (1) at the ends of the L-shaped member screwed longitudinally to it and on the same edge as for the notches, at least three rods are provided as integral part of this first half (1). These rods are so built in their lengths that, before starting a cycle, they can be chosen to suit the panels' breadth. In so doing, a greater possibility of loading more racks or panels in a given tank length, is provided.

The other half of the rack, pointed (2), is also formed by two members, parallel to each other and set spaced one over the other, exactly facing the ones on part (1) and having notches on their inside edge. These notches (3) like in part (1) are large enough to accept the panels' thickness and likewise equidistant spaced; the distance (5) of the two members, corresponds in altitude, exactly to the one between the L-shaped (1) members.

Fastened together by the rods (14), the members (2) are provided with holes at their ends so that rods (9), by entering them, can be secured by the device in FIG. 12 or by a simple thumb screw.

The above mentioned notches (3) on the members (1) and (2) are so shaped that by mating with the notches (8) on panel (6) not only provide a natural electrical contact (15) with the panels' edges, but also a mechanical support.

This latter is of extreme importance considering the various vibrations that the panels must withstand going through the process.

The tightning device in FIGS. 12, 13 consists of a bore built-in on the extremity of members (2), one for each end and one on top of rod (14) which, through the seal (10) being sqeezed by the bolt (11), secures the part (2) of the rack and panels with it.

The processing tanks (19), like the remaining ones, are provided with the tube (1A) to allow any rack loaded with panels (6) a standardized operation for different processes.

The FIG. 2 illustrates a process tank (20) having the anodes row connected on the lower end by a fork shaped member (21) held fast by screw (22). This member (21) is usualy made of titanium and the anodes can be either of solid metal or titanium gages filled with metal pellets.

The cathodic contact is accomplished, in subsequent order, from the part (1) and (2) of the rack, to the notches (3) of the L-shaped member and the notches (8) of the panels' edges.

The FIG. 3 illustrates another process tank (24), on whose floor a piping system (25) is layed which is intended, through derivating pipes directed upward and between the panels (6), to spray liquids on to the panels' surface evenly by means of a proportionally placed nozzles (26). Additionally, the process tank (24) has several portholes (26, 27, 28, 29) which are provided on the bottom of the tank, to permit the use of different liquids or water rinse, each with its own drain system and, not shown in the figure, with its own valve. The FIGS. (4, 5) illustrate where the industry stands today and how these racks are used. A rack, of which the top end is held to a transport cathode bar by a thumb screw and the panel (6), likewise is also tightned and held by additional thumb screws before and during the processing. With such a rack it is impossible to process magazine of panels since the cathode bars would represent, together with as many panels as spine racks, an enormous weight to lift; furthermore these racks culd not be loaded as quick and efficiently as for the invention here submitted. And the panels could not be set as close together as possible, since the thumb screws of the spine racks and the anode bars with their hooks and thickness would not allow it. Another advantage of the proposed invention is the fact that each panel gets its own anode avoiding overplating and burning of high current concentration areas. Furthermore the ratio between anode's area and cathode's area is easy to calculate, whereas with the conventional way, when small loads are plated, some anode area must be neutralized either taking the anode out or by insulting the anode's hook from the anode's bar.

The FIGS. 6 and 7 illustrate a panel (6) with its notches (8) on its edge. The notches (8) have a defined distance (5) and a distance (7) from the upper end of the panel.

The FIG. 7 illustrates the fitting of the notches (3) of the rack with the ones (8) of the panels exactly where the electrical contact, on both edges of the panel (6) takes place. The FIG. 8 illustrates a tool (31) to tighten and untighten the part (2) of the rack through rod (9).

Details of the tightening tool are illustrated in FIGS. 12 and 13, to which one should refer too.

The auxiliary tool (31) illustrated in a reduced scale in FIG. 8 and smaller than the rack in FIGS. 1, 2, 3, consists in a frame where the transmission (33) is to be found, whose axis is coupled with a motor belt (32), which is coupled with the tool (12) setting it in rotative motion. The above mentioned tool, through the clamping action of the spring (13), hooks itself onto the part (2) of the rack and through the motion of the motor (33), which transmit its motion to the tool (12), frees the rod (9) by untightening the bolt (11) which release its pressure on the seal (10); consequentially the part (2) of the rack can be pulled back just enough so that the notches (3) and (8) are free from each other. At this moment the panels are held vertically by the spring (34) and layed on the support plate (35).

With reference to FIGS. 9, 10, 11, a slotted wheel (36), able to accomodate the panels' thickness, enables the panels to return to the vertical position to be loaded onto the rack or to lay them on an conveyor fo the horizontal operations not included in the invention.

Figure 14:
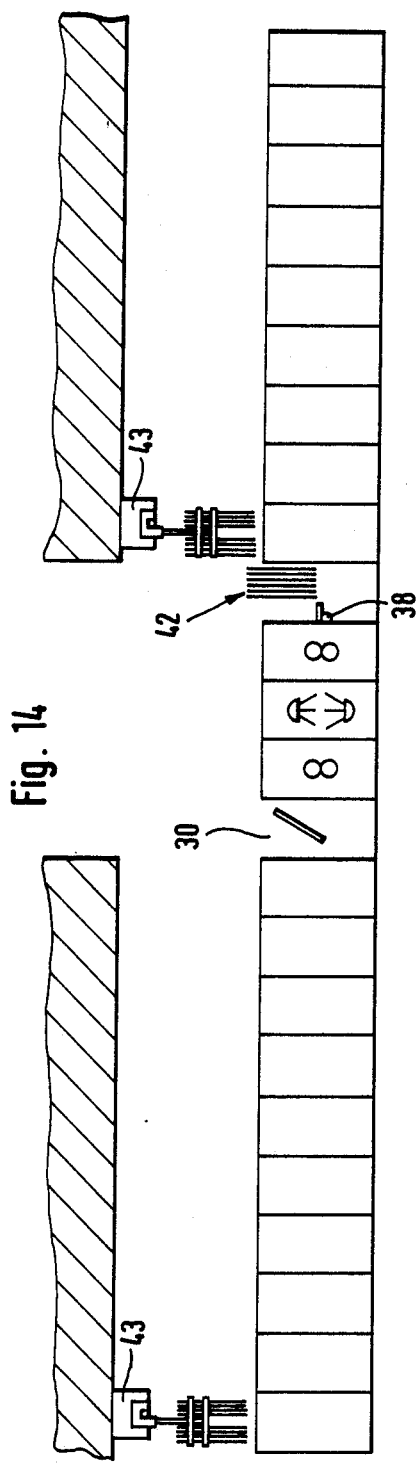
FIG. 14 is an elevation view of a production line including a coating or lamination or silk screen or ultra violet exposing station where the panels are unloaded and loaded fo the vertical operations concerning the invention.
Figure 15:
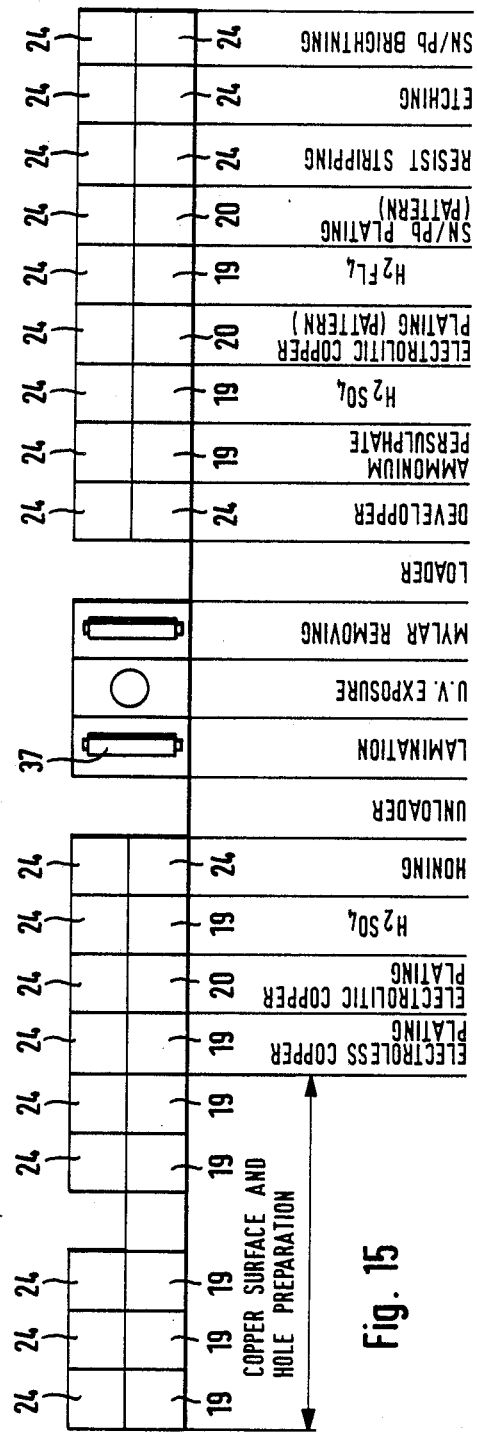
FIG. 15 is a plan view of a typical production line.

The FIGS. 14, 15 illustrate the insertion possibility of this rack in a production line. The production line (14) includes a laminator, or coating, or silk screen and/or an ultra violet exposing unit usually used in the industry.

As above described, the panels can be extracted from the rack's part (1, 2), and singularly processed through the above mentioned operations. After being processed through these above mentioned operations, the panels can be loaded again in the rack, automatically, and continue their travel through other plating applications and chemical technologies concerning the printed wired board production. See FIG. 15.

In FIG. 16 a version of the rack is illustrated of an automatic positioning of the panels through the anodes or nozzles; in this version part 1 and 2 are similar and are illustrated laying horizontaly, set in a loading fixture represented by part (44) and (45) jointed together, in a L-shaped assembly. In the vertical part (44), grooves are provided, spaced with the same dimension (4) as in FIG. (1). These grooves (46) unable the panels (6) to stay in a vertical postion so that the notches (3) can mate with the panels' edge line to prevent them to wander sideways. The notches (8) in FIG. 6 are seen facing down on part (45), mating with notches (3) on part (1) of the rack.

What I claim is:

1. A rack to securely hold, transport and provide an electrical contact, to one of multiple lots of panels in a magazine form, withstanding any vibration or pressure throughout a production process for manufacturing printed wired boards, comprising means for holding vertically secured panels of dielectric, cladded with conductive metallic foils, and permitting said panels to be inserted, with no obstruction into a process tank to perform duties of different natures, whereby said means for holding can enter vertically said tank without dismounting the panels carried, while maintaining an electrical contact, with an inside slanted surface of notches provided on panels of said means for holding and avoiding any damage to conductors of the printed wired boards etched in a conductive surface, already bonded on a dielectric base material, said means for holding comprising:
  a panel carrying frame means with two parallel frame members for firmly securing a plurality of panels;
  two first frame members assembled one over the other, parallel to each other, and rigidly connected by a plurality of metallic bars, exhibiting equally spaced first notches distributed at an appropriate distance for receiving plural panels;
  second frame members opposing said first frame members comprising two bars and plural means for rigidly joining said bars, said bars exhibit equally spaced second notches corresponding to and directed toward opposing first notches;
  means for displaceably fixing said first members at a distance from said second members and a tightening device for adjusting relational securing of said frame members:
  wherein said first and second notches are shaped in a manner to form electrical contact with notched edges of the panels;
  wherein said panels are arranged between said frame members so that the panels are kept captive sideways, and their weight pressing downward to provide electrical contact and being supported by said frame members at said notches wherein said first and second notches are at 90 degrees to said panel notches.

2. A rack according to claim 1, wherein said means for rigidly joining said bars is electrically conductive and said frame members, said means for rigidly joining, and said means for displaceably fixing are electrically connected to a cathode.

3. A rack according to claim 1, wherein said means for displaceably fixing are rigidly screwed to said first frame member, and said second opposing members slide on said means for displaceably fixing just enough to secure the panels in the respective notches.

4. A rack according to claim 3, wherein the means for displaceably fixing further comprises a rotating socket head bolt for turning an adjusting screw and seal means for preventing plated material build-up.

5. A rack according to claim 4, further comprising a tightening device means for closing and opening said rack.

6. A rack according to claim 1, wherein said first members exhibit guide bores and process tanks are provided with tube-shaped mounting supports in an inner area corresponding to said guide bores of the first members for perpendicular guiding and keeping the panels vertical.

7. A rack according to claim 6, further comprising a process tank provided with a system of tubes to transport liquids from a bottom network of tubes to vertically standing tubes built exactly in an interspace, between said panels so that nozzles mounted on said standing tubes are arranged to spray liquids over an entire panel surface.

8. A rack according to claim 7, wherein the process tanks further comprise a plurality of means for draining said tanks, each equipped with valve means for allowing different chemicals to flow into respective drainage reservoirs.

9. A rack according to claim 1, further comprising a process tank provided with a conductor fork-shaped frame generally made of titanium, resting on the bottom of said tank, and means for connecting at least one anode to said conductor frame.

10. A rack according to claim 6 wherein said first members are L-shaped and said guide bores are positioned in L-extensions of said L-shaped first members.

11. A rack to securely hold, transport and provide an electrical contact, to one of multiple lots of panels in a magazine form, withstanding any vibration or pressure throughout a production process for manufacturing printed wired boards, comprising means for holding vertically secured panels of dielectric material, cladded with conductive metallic foils, and permitting said panels to be inserted, with no obstruction into a process tank to perform duties of different natures, whereby said means for holding can enter vertically said tank without dismounting the panels carried, while maintaining an electrical contact, with an inside slanted surface of notches provided on panels of said means for holding and avoiding any damage to conductors of the printed wired boards etched in a conductive surface, already bonded on a dielectric base material, said means for holding comprising:
  a panel carrying frame means with two parallel frame members for firmly securing a plurality of panels;
  two first frame members assembled one over the other, parallel to each other, and rigidly connected by a plurality of metallic bars, exhibiting equally spaced first notches distributed at an appropriate distance for receiving plural panels;
  second frame members opposing said first frame members comprising two bars and plural means for rigidly joining said bars, said bars exhibit equally spaced second notches corresponding to and directed toward opposing first notches;
  means for displaceably fixing said first members at a distance from said second members and a tightening device for adjusting relational securing of said frame members;
  wherein said means for rigidly joining said bars is electrically conductive and said frame members, said means for rigidly joining, and said means for displaceably fixing are electrically connected to a cathode.

12. A rack according to claim 11, wherein said first members exhibit guide bores and process tanks are provided with tube-shaped mounting supports in an inner area corresponding to said guide bores of the first members for perpendicular guiding and keeping panels vertical.

13. A rack according to claim 12, further comprising a process tank provided with a system of tubes to transport liquids from a bottom network of tubes of vertically standing tubes built exactly in an interspace, between said panels so that nozzles mounted on said standing tubes are arranged to spray liquids over an entire panel surface.

14. A rack according to claim 13, wherein the process tanks further comprise a plurality of means for draining said tanks, each equipped with valve means for allowing different chemicals to flow into respective drainage reservoirs.

15. A rack according to claim 11, further comprising a process tank provided with a fork-shaped conductor frame generally made of titanium, resting on the bottom of said tank, and means for connecting at least one anode to said conductor frame.

16. A rack according to claim 12, wherein said first members are L-shaped and said guide bores are positioned in L-extensions of said L-shaped first members.

* * * * *